United States Patent
Abbasfar et al.

(10) Patent No.: US 8,149,972 B2
(45) Date of Patent: Apr. 3, 2012

(54) SIGNALING WITH SUPERIMPOSED CLOCK AND DATA SIGNALS

(75) Inventors: Aliazam Abbasfar, Mountain View, CA (US); Amir Amirkhany, Stanford, CA (US); Bruno W. Garlepp, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 894 days.

(21) Appl. No.: 12/128,584

(22) Filed: May 28, 2008

(65) Prior Publication Data

US 2008/0297213 A1 Dec. 4, 2008

Related U.S. Application Data

(60) Provisional application No. 60/940,940, filed on May 30, 2007.

(51) Int. Cl.
*H04L 7/00* (2006.01)
(52) U.S. Cl. ......... 375/354; 375/371
(58) Field of Classification Search .......... 375/354, 375/371, 373, 375, 376, 143; 327/141
See application file for complete search history.

(56) References Cited

U.S. PATENT DOCUMENTS

| | | | |
|---|---|---|---|
| 7,127,017 B1 | 10/2006 | Evans et al. | 375/355 |
| 7,257,183 B2 | 8/2007 | Dally et al. | 375/376 |
| 2006/0034395 A1 | 2/2006 | Evans et al. | 375/326 |
| 2007/0047683 A1* | 3/2007 | Okamura et al. | 375/355 |
| 2007/0058768 A1 | 3/2007 | Werner | 375/376 |
| 2007/0263757 A1 | 11/2007 | Dally et al. | 375/376 |
| 2007/0285177 A1* | 12/2007 | Werker | 331/16 |
| 2008/0084955 A1* | 4/2008 | Chen et al. | 375/376 |

FOREIGN PATENT DOCUMENTS

WO  WO 2008/085299  7/2008

* cited by examiner

*Primary Examiner* — Khai Tran
(74) *Attorney, Agent, or Firm* — Morgan, Lewis & Bockius LLP

(57) ABSTRACT

A data receiver circuit includes an interface to receive an input signal that includes a data signal and a clock signal superimposed on the data signal. The data signal has an associated symbol rate and an associated symbol period equal to the reciprocal of the associated symbol rate. The clock signal has a frequency N times the associated symbol rate, where N is an integer. A phase-locked loop (PLL) coupled to the interface extracts the clock signal from the input signal to provide an extracted clock signal. A phase interpolator adjusts the phase of the extracted clock signal to provide a phase-adjusted extracted clock signal. A sampling circuit samples the data signal at a sampling point. The sampling circuit is synchronized to the phase-adjusted extracted clock signal.

21 Claims, 12 Drawing Sheets

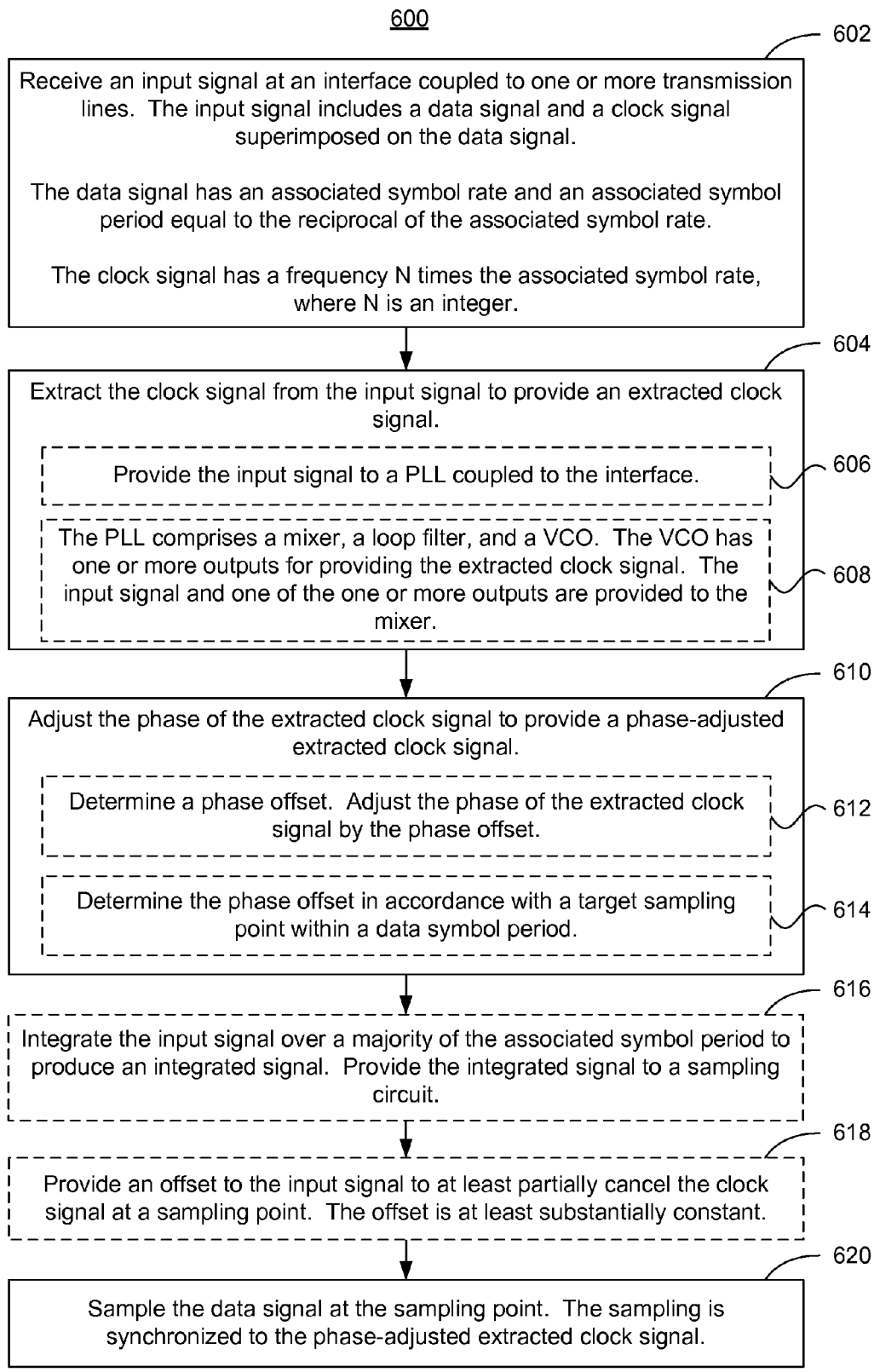

600

602 Receive an input signal at an interface coupled to one or more transmission lines. The input signal includes a data signal and a clock signal superimposed on the data signal.

The data signal has an associated symbol rate and an associated symbol period equal to the reciprocal of the associated symbol rate.

The clock signal has a frequency N times the associated symbol rate, where N is an integer.

604 Extract the clock signal from the input signal to provide an extracted clock signal.

606 Provide the input signal to a PLL coupled to the interface.

608 The PLL comprises a mixer, a loop filter, and a VCO. The VCO has one or more outputs for providing the extracted clock signal. The input signal and one of the one or more outputs are provided to the mixer.

610 Adjust the phase of the extracted clock signal to provide a phase-adjusted extracted clock signal.

612 Determine a phase offset. Adjust the phase of the extracted clock signal by the phase offset.

614 Determine the phase offset in accordance with a target sampling point within a data symbol period.

616 Integrate the input signal over a majority of the associated symbol period to produce an integrated signal. Provide the integrated signal to a sampling circuit.

618 Provide an offset to the input signal to at least partially cancel the clock signal at a sampling point. The offset is at least substantially constant.

620 Sample the data signal at the sampling point. The sampling is synchronized to the phase-adjusted extracted clock signal.

Figure 6A

SIGNALING WITH SUPERIMPOSED CLOCK AND DATA SIGNALS

RELATED APPLICATIONS

This application claims priority to U.S. Provisional Patent Application No. 60/940,940, titled "Signaling with Superimposed Clock and Data Signals," filed May 30, 2007, which is incorporated by reference herein in its entirety.

TECHNICAL FIELD

The disclosed embodiments relate generally to data communications, and more particularly, to data communications involving a clock signal superimposed on a data signal.

BACKGROUND

High speed data communications over a communications channel such as a backplane electrical link present significant engineering challenges. For example, edge-based clock and data recovery (CDR) limits receiver performance.

BRIEF DESCRIPTION OF THE DRAWINGS

FIGS. 6A-6B are flow diagrams illustrating a process for receiving data in accordance with some embodiments.

Like reference numerals refer to corresponding parts throughout the drawings.

DESCRIPTION OF EMBODIMENTS

Figure 1A:
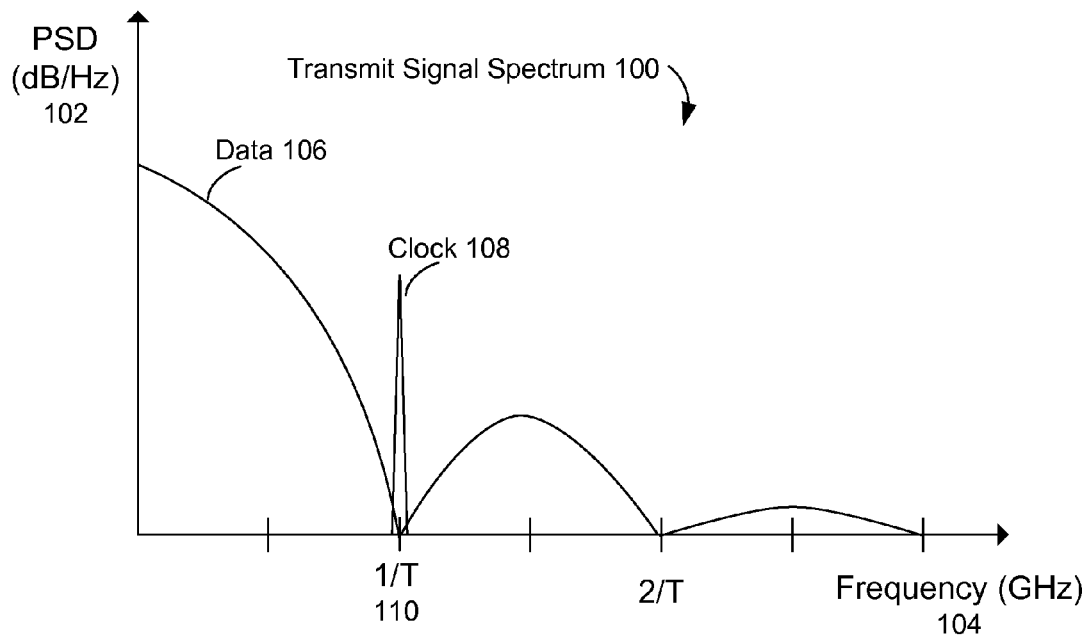
FIGS. 1A and 1B are prophetic transmit signal spectrums of a data signal and a clock signal superimposed on the data signal in accordance with some embodiments.

A data receiver circuit includes an interface to receive an input signal that includes a data signal and a clock signal superimposed on the data signal. The data signal has an associated symbol rate and an associated symbol period equal to the reciprocal of the associated symbol rate. The clock signal has a frequency N times the associated symbol rate, where N is an integer. A phase-locked loop (PLL) coupled to the interface extracts the clock signal from the input signal to provide an extracted clock signal. A phase interpolator adjusts the phase of the extracted clock signal to provide a phase-adjusted extracted clock signal. A sampling circuit samples the data signal at a sampling point. The sampling circuit is synchronized to the phase-adjusted extracted clock signal.

In some embodiments, the PLL extracts the clock signal by downconverting the input signal to an intermediate frequency (IF) signal, bandpass filtering the IF signal to provide a filtered IF signal, and downconverting the filtered IF signal to produce a VCO control signal.

A data transmission circuit includes a data driver and a clock driver. The data driver receives a data signal having an associated symbol rate and an associated symbol period equal to the reciprocal of the associated symbol rate, and drives the data signal onto one or more output paths. The clock driver receives a clock signal having a frequency N times the associated symbol rate, where N is an integer, and drives the clock signal onto the one or more output paths, such that the data signal and the clock signal are driven onto the one or more output paths simultaneously.

A method of receiving data includes receiving an input signal at an interface. The input signal includes a data signal and a clock signal superimposed on the data signal. The data signal has an associated symbol rate and an associated symbol period equal to the reciprocal of the associated symbol rate. The clock signal has a frequency N times the associated symbol rate, where N is an integer. The clock signal is extracted from the input signal to provide an extracted clock signal. The phase of the extracted clock signal is adjusted to provide a phase-adjusted extracted clock signal. The data signal is sampled at a sampling point. The sampling is synchronized to the phase-adjusted extracted clock signal.

In some embodiments, extracting the clock signal from the input signal includes downconverting the input signal to an IF signal, bandpass filtering the IF signal to provide a filtered IF signal, and downconverting the filtered IF signal to produce an oscillator control signal.

A method of transmitting data comprises receiving for transmission a data signal having an associated symbol rate and an associated symbol period equal to the reciprocal of the associated symbol rate; receiving for transmission a clock signal having a frequency N times the associated symbol rate, where N is an integer; and simultaneously driving the data signal and the clock signal onto one or more output paths.

A computer readable medium contains circuit description data that, when operated on by a circuit compiler program being executed by a processor, synthesizes a data receiver circuit. The circuit description data includes a description of an interface to receive an input signal that includes a data signal and a clock signal superimposed on the data signal. The data signal has an associated symbol rate and an associated symbol period equal to the reciprocal of the associated symbol rate. The clock signal has a frequency N times the associated symbol rate, where N is an integer. The circuit description data further includes descriptions of a PLL coupled to the interface for extracting the clock signal from the input signal to provide an extracted clock signal, a phase interpolator for adjusting the phase of the extracted clock signal to provide a phase-adjusted extracted clock signal; and a sampling circuit for sampling the data signal at a sampling point, wherein the sampling circuit is synchronized to the phase-adjusted extracted clock signal.

A computer readable medium contains circuit description data that, when operated on by a circuit compiler program being executed by a processor, synthesizes a data transmission circuit. The circuit description data includes a description of a data driver and a clock driver. The data driver receives a data signal having an associated symbol rate and an associated symbol period equal to the reciprocal of the associated symbol rate, and drives the data signal onto one or more output paths. The clock driver receives a clock signal having a frequency N times the associated symbol rate, where N is an integer, and drives the clock signal onto the one or more output paths, such that the data signal and the clock signal are driven onto the one or more output paths simultaneously.

A data receiver circuit includes means for receiving an input signal at an interface. The input signal includes a data signal and a clock signal superimposed on the data signal. The data signal has an associated symbol rate and an associated symbol period equal to the reciprocal of the associated symbol rate. The clock signal has a frequency N times the associated symbol rate, where N is an integer. The data receiver circuit also includes means for extracting the clock signal from the input signal to provide an extracted clock signal; means for adjusting the phase of the extracted clock signal to provide a phase-adjusted extracted clock signal; and means for sampling the data signal at a sampling point, wherein the sampling is synchronized to the phase-adjusted extracted clock signal.

In some embodiments, the means for extracting the clock signal from the input signal to provide an extracted clock signal include means for downconverting the input signal to an IF signal, means for bandpass filtering the IF signal to provide a filtered IF signal, and means for downconverting the filtered IF signal to produce an oscillator control signal.

A data transmission circuit includes means for receiving for transmission a data signal having an associated symbol rate and an associated symbol period equal to the reciprocal of the associated symbol rate; means for receiving for transmission a clock signal having a frequency N times the associated symbol rate, where N is an integer; and means for simultaneously driving the data signal and the clock signal onto one or more output paths.

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the embodiments.

Figure 1B:
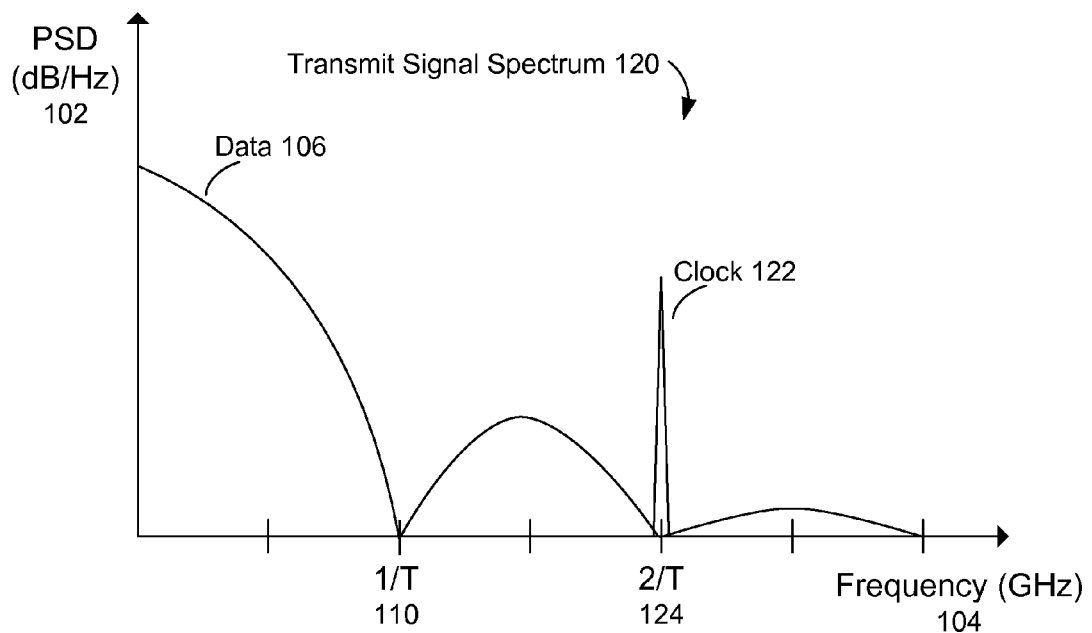

FIGS. 1A and 1B are prophetic transmit signal spectrums 100 (FIG. 1A) and 120 (FIG. 1B) of a data signal and a clock signal superimposed on the data signal in accordance with some embodiments. The transmit signal spectrums 100 and 120 are represented by power spectral density (PSD) 102 as a function of frequency 104, where PSD 102 is measured in decibels per hertz (dB/Hz) and frequency 104 is measured in gigahertz (GHz). In some embodiments, the data signal and superimposed clock signal are transmitted over a channel, such as a backplane link implemented as one or more traces on one or more printed circuit boards, a channel in a network (e.g., an Ethernet network), or a signal path on a semiconductor device. In some embodiments, the channel includes one or more transmission lines. For example, the data signal and/or the superimposed clock signal may be transmitted as differential signals over a pair of transmission lines. In some embodiments, the data signal and the superimposed clock signals are simultaneously driven onto the channel by line drivers, such as digital-to-analog converters (DACs) (e.g., zero-order hold DACs).

The data signal 106 has a symbol period T and a symbol rate 1/T 110. In some embodiments, the clock signal has a frequency equal to an integer multiple of the symbol rate. For example, in the transmit signal spectrum 100, clock 108 has a frequency equal to the symbol rate 110 (i.e., the integer multiple is one). In some embodiments, the integer multiple is greater than or equal to two. For example, in the transmit signal spectrum 120, clock 122 has a frequency 124 equal to twice the symbol rate 110 (i.e., the integer multiple is two).

Figure 2A:
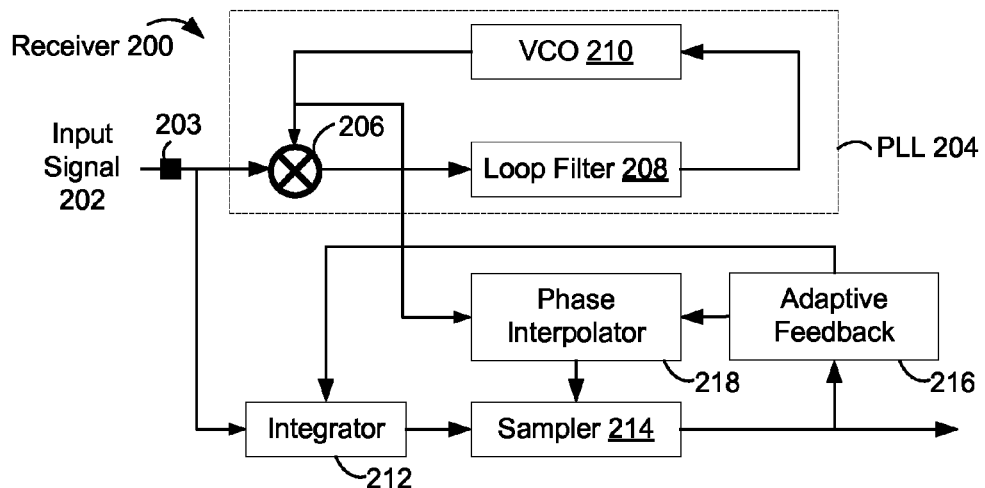
FIGS. 2A-2E are block diagrams of receivers in accordance with some embodiments
Figure 2B:
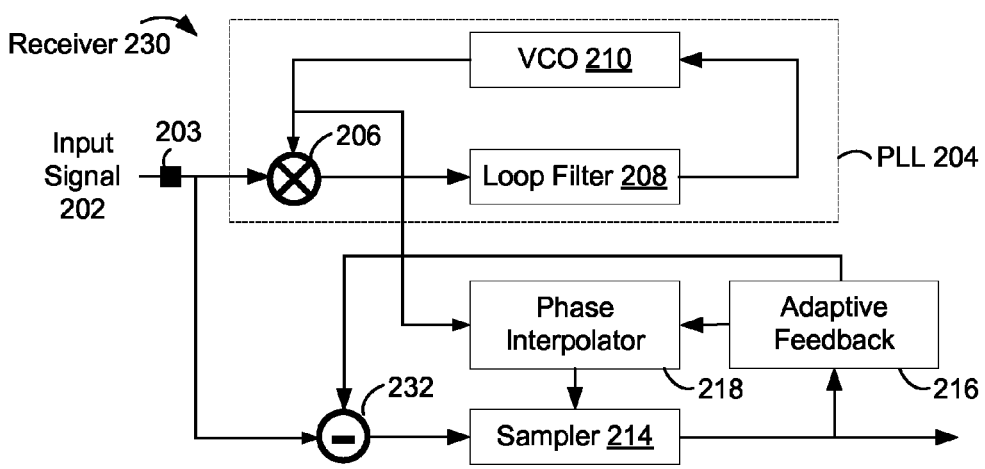
Figure 2C:
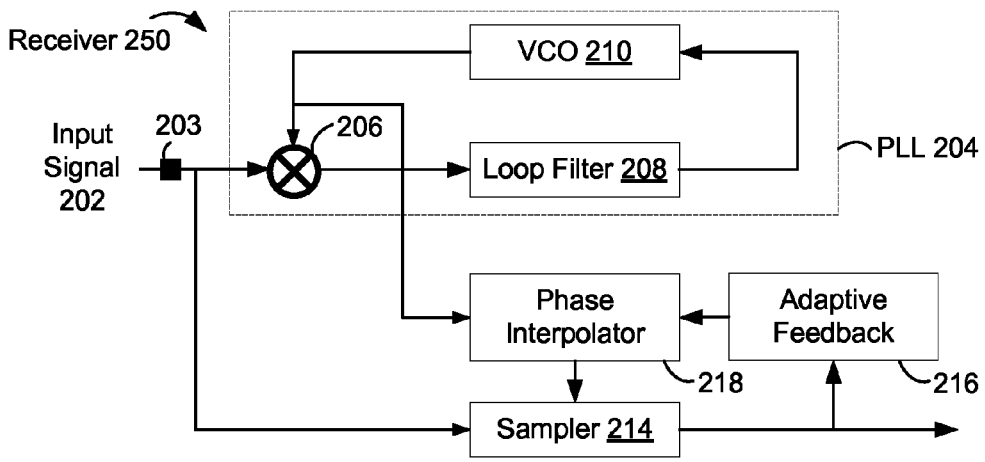

FIGS. 2A-2C are block diagrams of receivers 200, 230, and 250 in accordance with some embodiments. The receiver 200, 230, or 250 receives at an interface 203 an input signal 202 that includes a data signal (e.g., data signal 106) and a clock signal (e.g., clock signal 108 or 122) superimposed on the data signal. In some embodiments, the interface 203 includes one or more pins, balls, or other electrical contacts on a semiconductor package. In some embodiments, the receiver includes a phase-locked loop (PLL) 204 for extracting the clock signal from the input signal to provide an extracted clock signal. In some embodiments, the PLL 204 includes a mixer 206, a loop filter 208, and a voltage-controlled oscillator (VCO) 210. The VCO 210 has one or more outputs for providing the extracted clock signal. The input signal 202 and one of the one or more VCO outputs are provided as inputs to the mixer 206, which acts as a phase detector. The output of the mixer 206 is filtered by the loop filter 208 and provided as a control signal to the input of the VCO 210. As noted above, the input signal 202 may be a single ended signal transmitted on a single signal line, or it may be a differential signal transmitted on a pair of signal lines.

In some embodiments, the VCO 210 outputs multiple phases of the extracted clock signal. In some embodiments, the VCO 210 outputs multiple copies of the extracted clock signal having the same phase. In some embodiments, the VCO 210 can be replaced by a current-controlled oscillator (CCO) or another frequency-controllable oscillator.

In some embodiments, the extracted clock signal is provided to a phase interpolator 218, which adjusts the phase of the extracted signal and provides a phase-adjusted extracted clock signal to a sampling circuit 214. The sampling circuit 214 samples the data signal at a sampling point.

In some embodiments, in which the VCO 210 outputs multiple copies of the extracted clock signal having the same phase, the copy of the extracted clock signal provided to the phase interpolator 218 is separate from the copy of the extracted clock signal provided to the mixer 206.

In some embodiments, if the integer multiple of the clock signal frequency to the data symbol rate is greater than one, a clock divider (not shown) divides the extracted clock signal by a factor equal to the integer multiple. In some embodiments, the divided extracted clock signal is provided to the phase interpolator 218.

In some embodiments, the phase interpolator 218 adjusts the phase of the extracted signal by a phase offset determined by an adaptive feedback circuit 216. In some embodiments, the adaptive feedback circuit 216 operates like CDR loop circuitry to determine the phase offset in accordance with a target sampling point within a data symbol period and to drive the phase interpolator to adjust the phase of the extracted clock signal provided to the sampling circuit 214, such that the sampling circuit 214 samples the input signal in proximity to the target sampling point within a data symbol period. For example, the target sampling point may correspond to an opening in an eye diagram for the data signal. In some embodiments, the target sampling point corresponds to a receiver bit-error rate (BER) below a specified value or to a substantially minimized BER.

In some embodiments, an integrator 212 (FIG. 2A) integrates the input signal 202 over a majority of the data symbol period and provides the integrated signal to the sampling circuit 214 for sampling. Integrating the input signal over a majority of the data symbol period at least partially cancels the clock signal, thereby allowing the sampling circuit 214 to sample the integrated data signal without excessive interference from the clock signal. For example, the integrator 212 integrates the input signal over 60% of the data symbol period, or over 80% of the data symbol period. In some embodiments, the period over which integration is performed includes the entire data symbol period. In some embodiments, the period over which integration is performed excludes data transitions, thereby avoiding noise associated with transitions and corruption from adjacent data symbols. As shown in FIG. 2A, the timing and control of the integrator 212 can be determined by the adaptive feedback circuit 216. In some embodiments, the adaptive feedback circuit 216 may receive the extracted clock signal and may include phase detectors, phase interpolators, clock drivers and other miscellaneous circuitry and logic to synthesize timing and control signals for the integrator 212.

In some embodiments, the integrator 212 performs an integrate-and-dump operation: the value of the integrator is zeroed after the integrated data signal is provided to the sampling circuit 214. In some embodiments, the period (which includes a majority of the data symbol) over which integration is performed excludes time during which the integrator is reset (e.g., zeroed).

In some embodiments, the data symbol period is determined by a clock and data recovery (CDR) circuit (e.g., incorporated as part of the adaptive feedback circuit 216).

In some embodiments, an offset cancellation circuit 232 (FIG. 2B) provides an offset to the input signal 202 to at least partially cancel the clock signal at the sampling point, thereby allowing the sampling circuit 214 to sample the data signal without excessive interference from the clock signal at the sampling point. In some embodiments, the adaptive feedback circuit 216 determines the offset provided by the offset cancellation circuit 232. For example, the feedback circuit 216 determines an offset that provides a suitable opening in an eye diagram associated with the data signal. An example of an algorithm for determining the offset is to determine the top voltage level and the bottom voltage level of an eye opening in the eye diagram and to average the values of the two voltage levels.

In some embodiments, the offset is substantially constant. For example, the offset does not change between consecutive clock cycles or symbol periods, although the adaptive feedback circuit 216 may modify the offset on occasion to ensure that the sampling circuit 214 can reliably sample the data signal.

In some embodiments, the integrator 212 and the offset cancellation circuit 232 are absent (FIG. 2C). The phase interpolator 218 adjusts the phase of the extracted signal provided to the sampling circuit 214 such that the sampling circuit 214 samples the input signal 202 at or near a zero crossing of the clock signal, thereby allowing the sampling circuit 214 to sample the data signal without excessive interference from the clock signal.

Figure 2D:
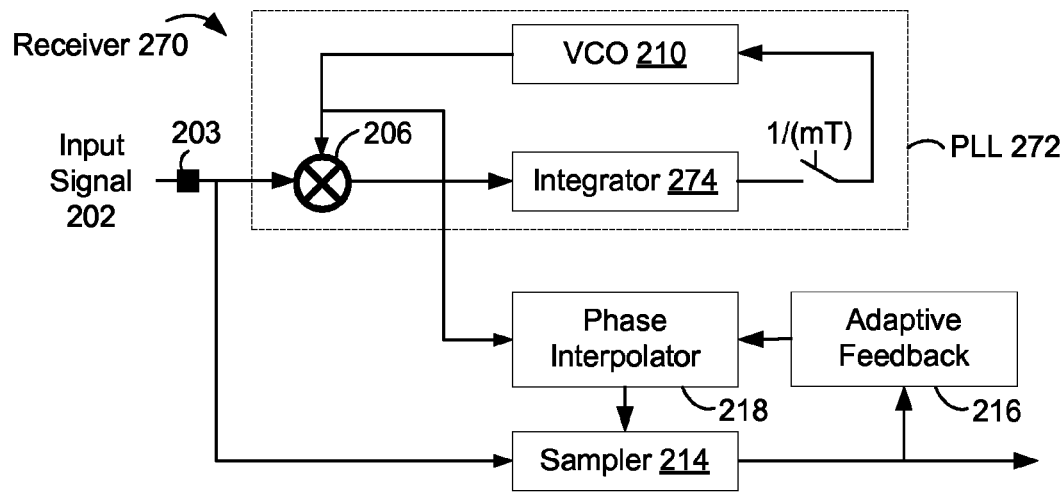

In some embodiments, the loop filter 208 in the PLL 204 is implemented as an m-period integrator. FIG. 2D is a block diagram of a receiver 270 in which the PLL 272 includes an m-period integrator 274, in accordance with some embodiments. The input signal 202 and one of the one or more VCO outputs are provided as inputs to the mixer 206. The output of the mixer 206 is integrated over m data symbol periods, where m is an integer, and provided as a control signal to the input of the VCO 210. A loop filter circuit (not shown) may be included between the output of integrator 274 and VCO 210.

In some embodiments, the receiver includes a filter (e.g., a high-pass filter or a bandpass filter) coupled to the input of the PLL, or within the PLL and coupled to the input of the mixer 206, to filter the input signal provided to the PLL (e.g., to reduce some of the data signal's spectral content from the input signal).

Figure 2E:
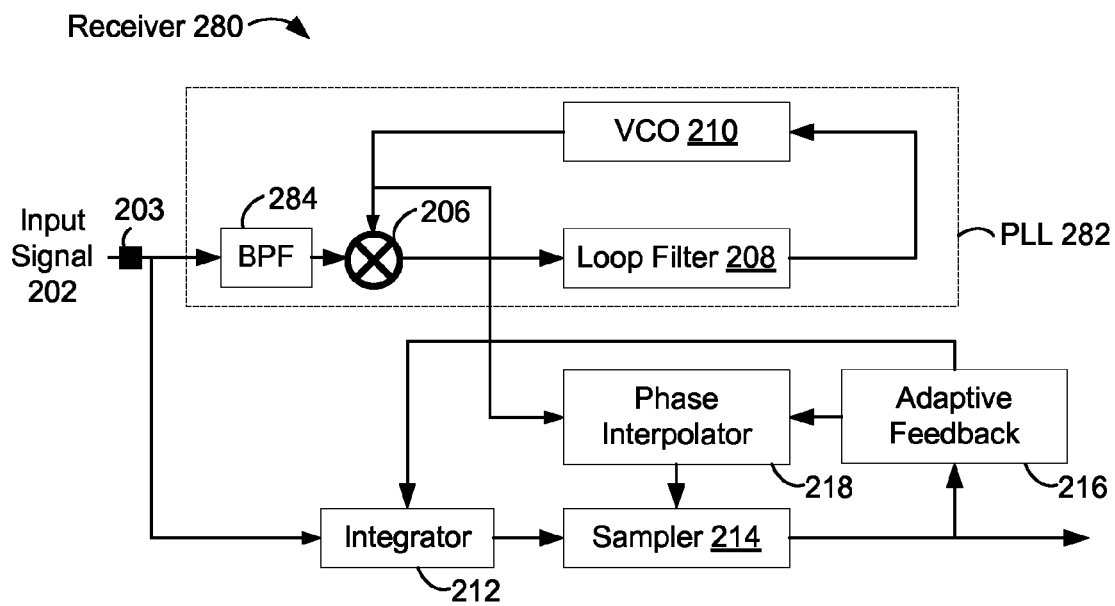

FIG. 2E is a block diagram of a receiver 280 in which the PLL 282 includes a bandpass filter 284 that filters the input signal 202 and provides the filtered input signal to the mixer 206, in accordance with some embodiments. A passband of the bandpass filter 284 is approximately centered on the frequency of the clock signal. The bandpass filter 284 filters from the input signal a portion of the data signal's spectral content, thereby reducing jitter in the clock signal extracted by the PLL 282. In some embodiments, the bandpass filter 284 is implemented externally to the PLL 282.

In some embodiments, the clock signal (e.g., clock signal 108 or 122) is extracted from the input signal 202 with a PLL that uses heterodyne detection. The input signal is down-converted to an intermediate frequency, filtered to isolate the clock signal, and then further down-converted to produce an oscillator control signal (e.g., a VCO control signal).

Figure 3A:
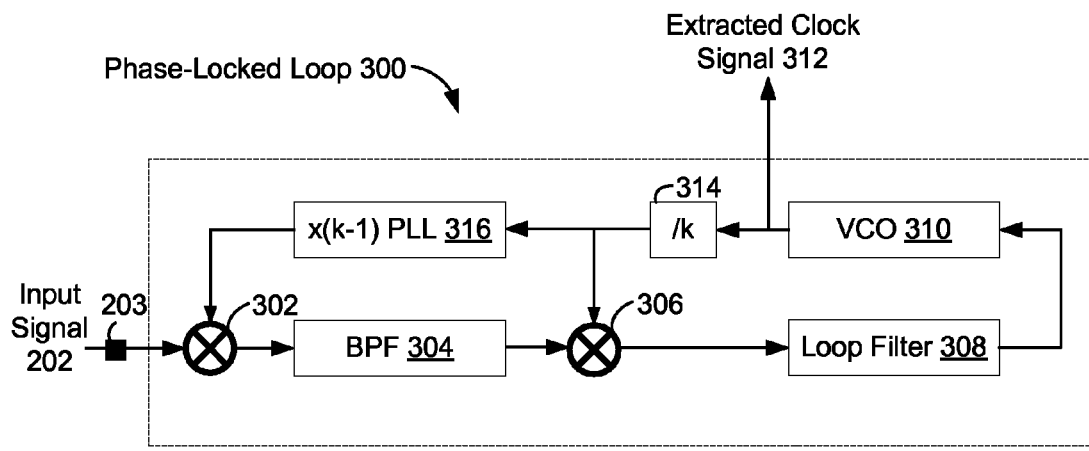
FIGS. 3A and 3B are block diagrams of phase-locked loops (PLLs) with heterodyne detection in accordance with some embodiments.
Figure 3B:
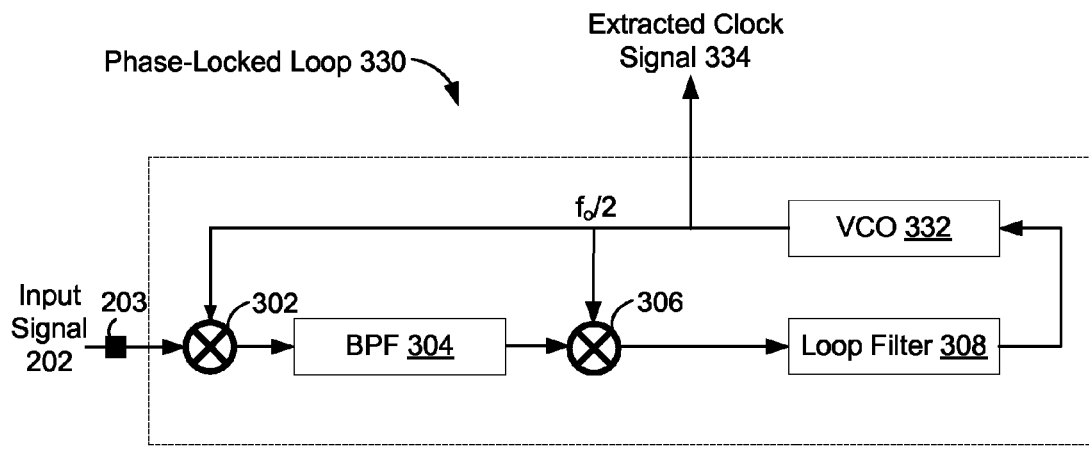

FIGS. 3A and 3B are block diagrams of PLLs 300 and 330 with heterodyne detection in accordance with some embodiments. The PLLs receive an input signal 202 including a data signal and a clock signal superimposed on the data signal. In some embodiments, the clock signal has a frequency $f_o$ equal to an integer multiple of the data symbol rate, where the integer is greater than or equal to one. The input signal and a first internally generated clock signal with a frequency equal to $$\frac{k-1}{k} f_o,$$

where k is an integer greater than one, are provided as inputs to a first mixer 302. The first mixer 302 down-converts the input signal to an intermediate frequency (IF) signal, such that the clock-signal component of the IF signal has a frequency of $$f_o - \frac{k-1}{k} f_o = \frac{1}{k} f_o.$$

A bandpass filter 304 filters the IF signal and provides the filtered IF signal to an input of a second mixer 306. In some embodiments, the bandpass filter 304 includes a gain stage that amplifies the IF signal. A second internally generated clock signal with a frequency equal to $$\frac{1}{k} f_o$$

is provided to a second input of the second mixer 306, which downconverts the filtered IF signal to produce a VCO control signal that is filtered by a loop filter 308 and provided to a VCO 310. The VCO 310 outputs one or more copies and/or one or more phases of an extracted signal 312 with a frequency $f_o$. In some embodiments, the second mixer 306 can be replaced by another phase detecting circuit such as a tri-state phase detector or an XOR phase detector.

The PLL 300 outputs one of the one or more copies of the extracted clock signal 312, for example to a phase interpolator (e.g., phase interpolator 218) that adjusts the phase of the extracted clock signal and provides a phase-adjusted extracted clock signal to a sampling circuit (e.g., sampling circuit 214). In addition, one of the one or more copies of the extracted signal 312 is provided to a clock divider 314 to generate the second internally generated clock signal. The second internally generated clock signal is provided to a PLL 316 that generates an output frequency equal to (k−1) times the input frequency (i.e., a x(k−1) PLL). The PLL 316 outputs the first internally generated clock signal.

In some embodiments, the VCO outputs a signal with a frequency of $$\frac{1}{k} f_o,$$

a copy of which is provided as the second internally generated clock signal to the second mixer 306. The PLL 300 provides the signal to a second PLL (not shown) that multiples the frequency by k, thus restoring the frequency to $f_o$, and provides the restored signal to a phase interpolator, for example, or to a sampling circuit.

In some embodiments, the loop filter 308 provides a filtered VCO control signal to a VCO 332 (PLL 330; FIG. 3B) that outputs one or more copies and/or one or more phases of an extracted clock signal 334 with a frequency equal to (or substantially equal to)

$$\frac{1}{2} f_o.$$

Thus, in some embodiments, the frequency of the extracted clock signal is not equal to the frequency of the clock signal superimposed on the data signal in the input signal 202.

One of the one or more copies of the extracted clock signal 334 is provided as the second internally generated clock signal to the second mixer 306. In addition, one of the one or more copies of the extracted clock signal 334 is provided as the first internally generated clock signal to the first mixer 302. The clock divider 314 and the x(k−1) PLL 316 are absent in this embodiment. Thus, in some embodiments, the first and second internally generated clock signals are the same signal.

The PLL 330 outputs one of the one or more copies of the extracted clock signal 334, for example to a phase interpolator (e.g., phase interpolator 218) that adjusts the phase of the extracted clock signal and provides phase-adjusted extracted clock signals to two sampling circuits (e.g., sampling circuits 214) that operate in an alternating fashion (DDR) to extract the data from the input signal 202.

Figure 4A:
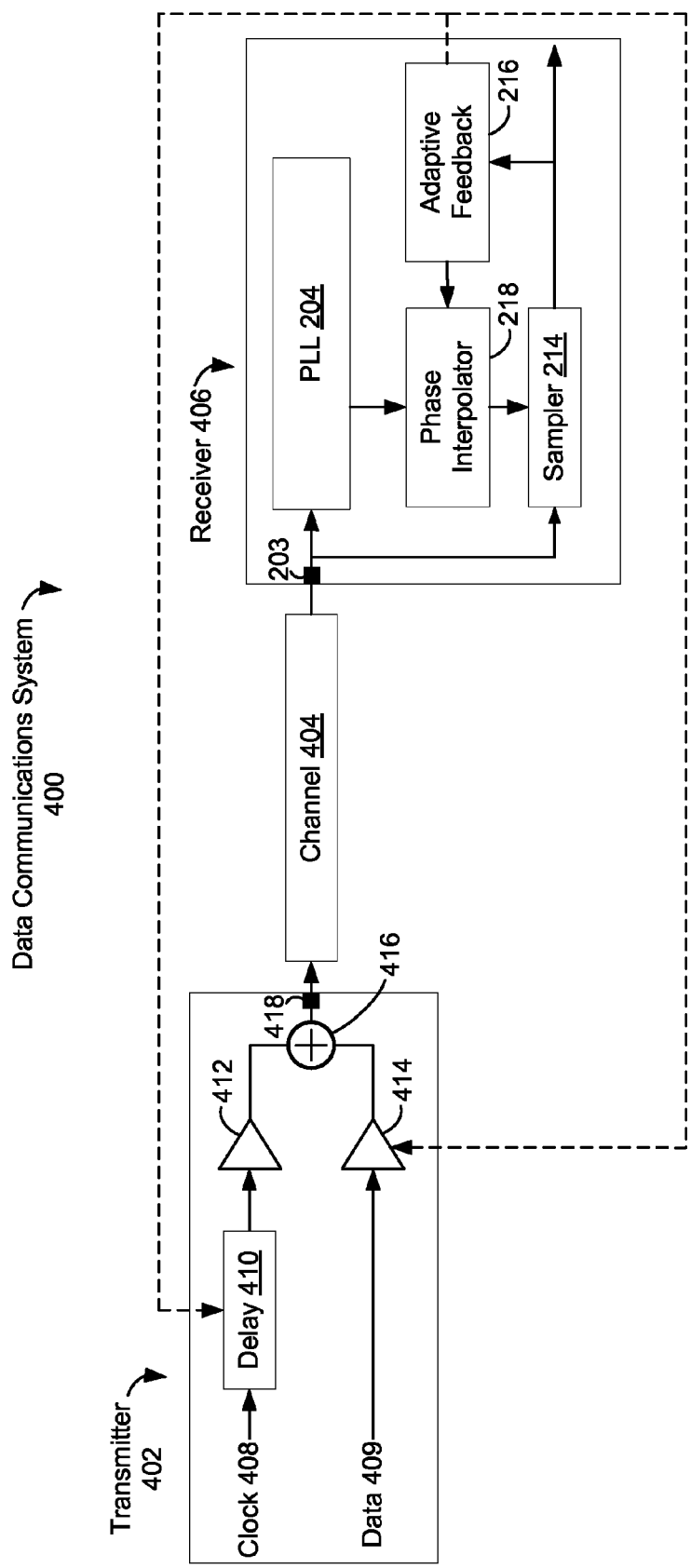
FIGS. 4A-4B are block diagrams of a data communications system in accordance with some embodiments.

FIG. 4A is a block diagram of a data communications system 400 in accordance with some embodiments. The data communications system 400 includes a transmitter 402, a channel 404, and a receiver 406. In some embodiments, the receiver 406 corresponds to receiver 200, 230, 250, 270, or 280 (FIGS. 2A-2E). In some embodiments, the channel 404 includes one or more transmission lines.

The transmitter 402 includes a clock driver 412 that drives a clock signal 408, a data driver 414 that drives a data signal 409, and a combiner 416 that combines the clock signal 408 and the data signal 409 (i.e., superimposes the clock signal on the data signal) and drives the combined signals onto the channel 404 via an interface 418. In some embodiments, the combiner 416 may be a wired-OR connection of the outputs of clock driver 412 and data driver 414. In some embodiments, the interface 418 includes one or more pins, balls, or other electrical contacts on a semiconductor package.

In some embodiments, the clock signal 408 passes through a variable delay circuit 410 prior to the clock driver 412. Adjusting the delay associated with the variable delay circuit 410 adjusts the phase of the clock signal 408 with respect to the data signal 409. In some embodiments, the delay associated with the variable delay circuit 410 is adjusted according to feedback from the adaptive feedback circuit 216 in the receiver 406.

In some embodiments, the data driver 414 includes a programmable linear equalizer (e.g., a symbol-rate or fractionally spaced linear equalizer) that equalizes the data signal 409. In some embodiments, the equalizer is programmed according to feedback from the adaptive feedback circuit 216 in the receiver 406.

In some embodiments, the adaptive feedback circuit 216 specifies a delay value for the variable delay circuit 410 and/or equalizer settings for the data driver 414 that reduce or minimize a BER associated with the receiver 406. For example, the feedback circuit 216 determines a delay value and/or equalizer settings that provide a suitable opening in an eye diagram associated with the data signal. In some embodiments, the delay value is chosen such that the sampling point of the sampler 214 is at or near a zero crossing of the clock signal.

In some embodiments, the adaptive feedback circuit 216 communicates with the variable delay circuit 410 and/or with the data driver 414 via the channel 404: a transmitter coupled to the receiver 406 transmits, via the channel 404, data specifying a delay value and/or equalizer settings to a receiver coupled to the transmitter 402. In some embodiments, the adaptive feedback circuit 216 communicates with the variable delay circuit 410 and/or with the data driver 414 via a backchannel separate from the channel 404.

Figure 4B:
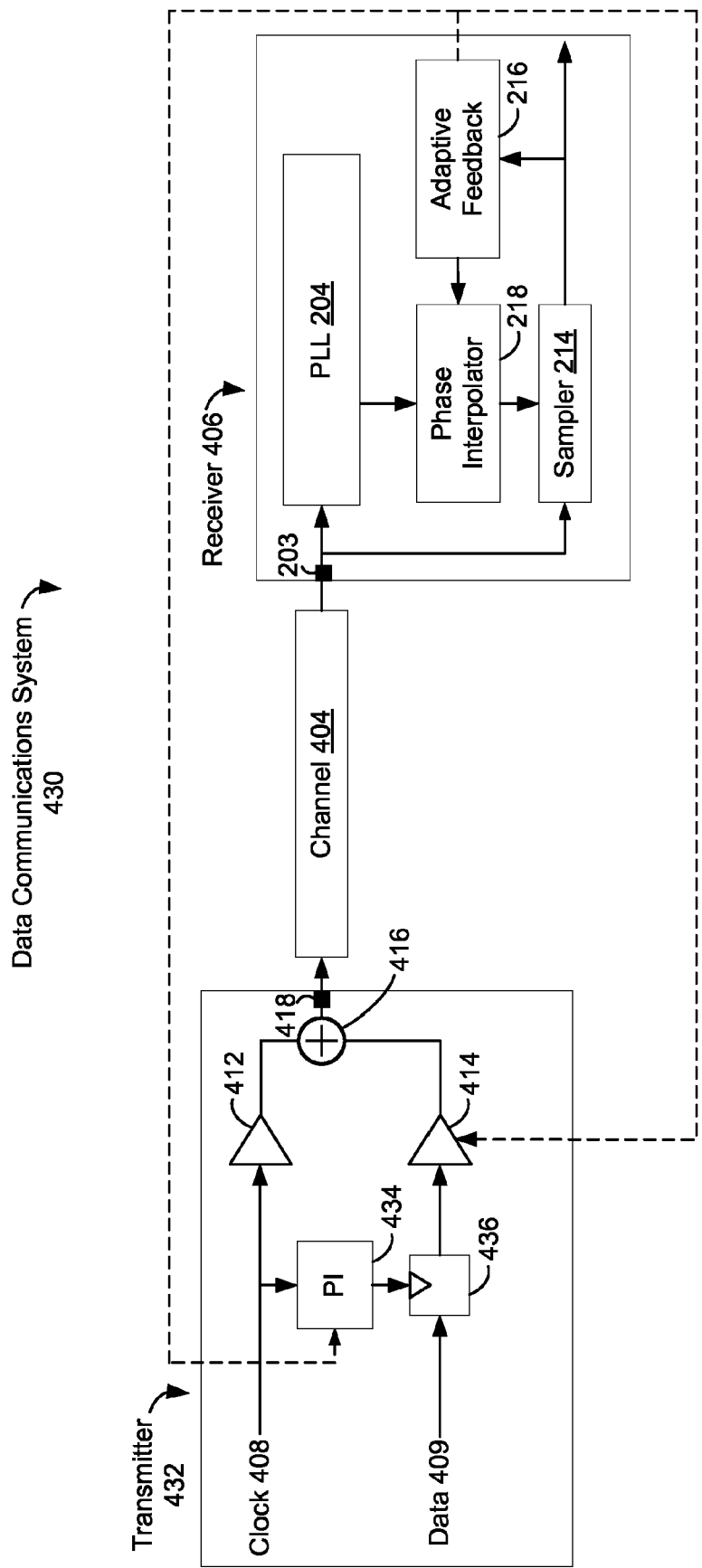

FIG. 4B is a block diagram of a data communications system 430 in accordance with some embodiments. The data communications system 430 includes a transmitter 432, a channel 404, and a receiver 406. The transmitter 432 includes, in addition to the clock driver 412, data driver 414, and combiner 416, a phase interpolator 434 that adjusts the phase of the clock signal 408 and provides the phase-adjusted clock signal to a data retimer 436. The data retimer 436 provides the data signal 409 to the data driver 414 at a frequency corresponding to the clock signal 408 frequency. The clock signal frequency thus corresponds to the symbol rate of the data signal.

In some embodiments, the clock signal frequency is an integer multiple of the symbol rate of the data signal, where the integer is greater than one, and the transmitter 432 further includes a clock divider (not shown) with a divider ratio corresponding to the integer multiple. In some embodiments, the clock divider receives the clock signal 408 as input and provides the divided clock signal to the input of the phase interpolator 434. In some embodiments, the clock divider receives the phase-adjusted clock signal from the phase interpolator 434 as input and provides the divided phase-adjusted clock signal to the data retimer 436.

In some embodiments, the phase interpolator adjusts the phase of the clock signal provided to the data retimer 436 by a phase offset. In some embodiments, the adaptive feedback circuit 216 specifies the phase offset, for example via the channel 404 or via a separate backchannel between the receiver 406 and the transmitter 402. In some embodiments, the phase offset is determined to reduce or minimize a BER associated with the receiver 406. For example, the phase offset may be determined such that the sampling circuit 214 samples the data signal at or near a zero crossing of the clock signal.

In some embodiments, one or more transmitters and one or more receivers may be implemented together in a single integrated circuit (i.e., on a single chip).

Figure 4C:
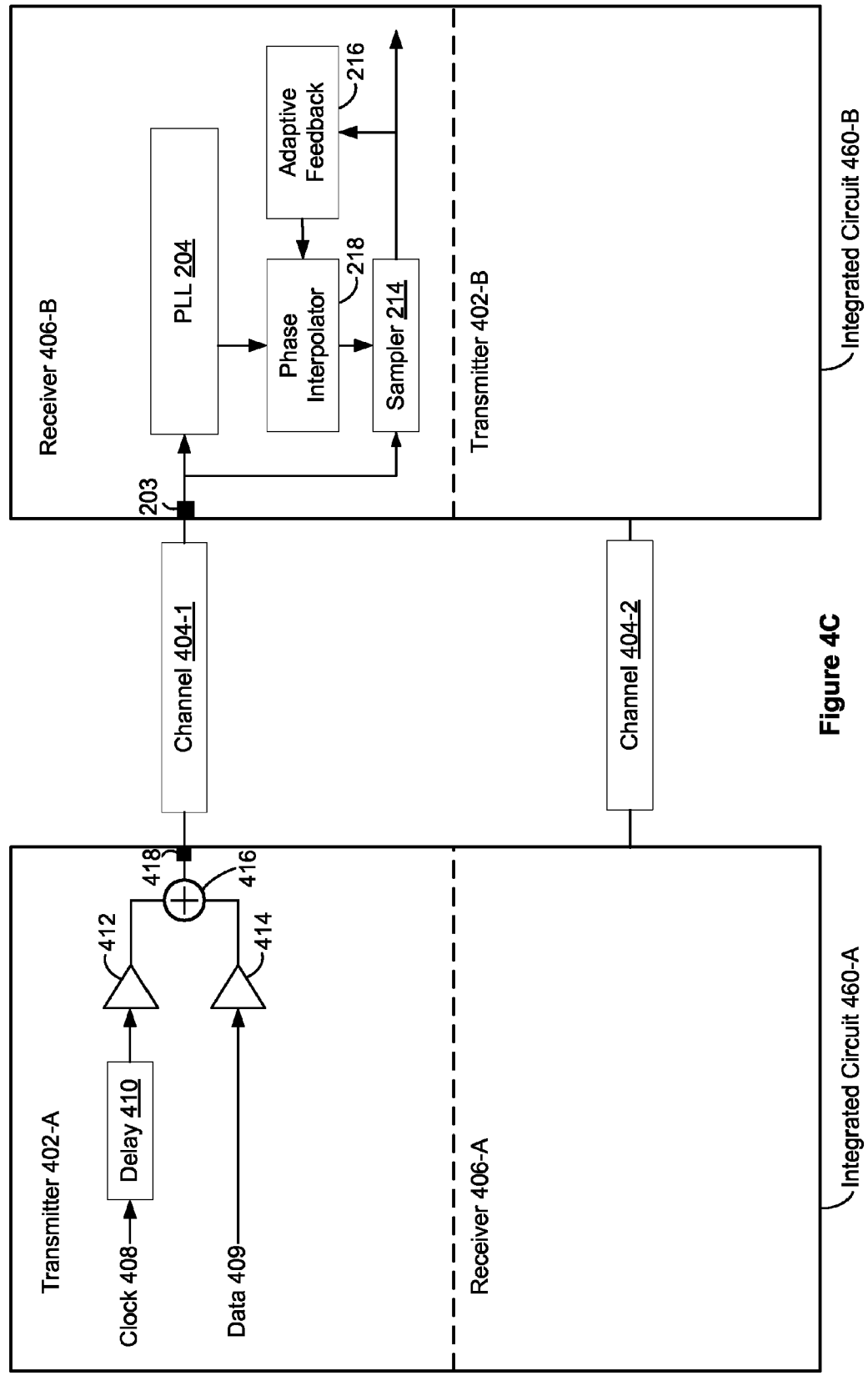
FIG. 4C is a block diagram of two integrated circuits, each having a transmitter and a receiver, in accordance with some embodiments.

FIG. 4C is a block diagram of two integrated circuits 460-A and 460-B, each having a transmitter 402 and a receiver 406, in accordance with some embodiments. Each transmitter 402 and each receiver 406 includes the components described above with regard to FIG. 4A. In some embodiments, instead of a transmitter 402, each integrated circuit 460-A and 460-B has a transmitter 432 (FIG. 4B) or similar transmitter. Integrated circuit 460-A may transmit a first data transmission signal, including a data signal 409 and a clock signal 408 superimposed on the data signal, to integrated circuit 460-B via channel 404-1 and may receive a second data transmission signal from integrated circuit 460-B via channel 404-2. Alternatively, integrated circuit 460-A may both transmit and receive data transmission signals via a single channel (not shown).

In some embodiments, a clock signal superimposed on a data signal has a frequency that is not equal to an integer multiple of the data signal's symbol rate. For example, instead of a clock frequency equal to $$N\left(\frac{1}{T}\right),$$

where N is an integer and T is the symbol period, the clock frequency may be equal to $$\frac{N}{M}\left(\frac{1}{T}\right),$$

where N and M are integers.

Figure 5:
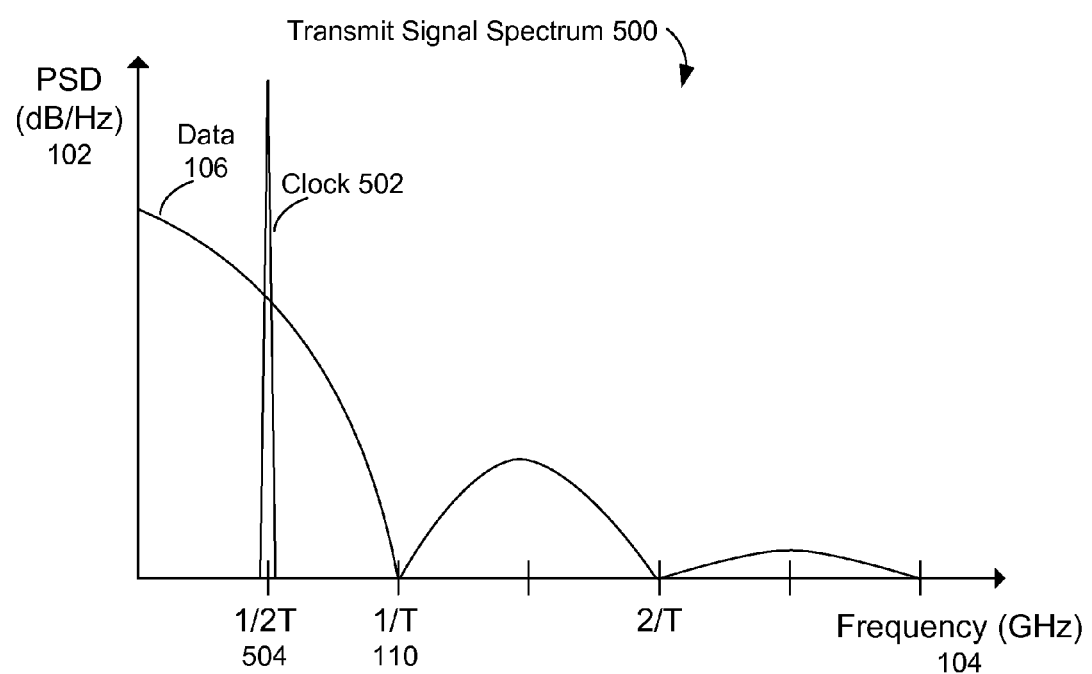
FIG. 5 is a prophetic transmit signal spectrum of a data signal and a clock signal superimposed on the data signal in accordance with some embodiments.

FIG. 5 is a prophetic transmit signal spectrum 500 of a data signal 106 and a clock signal 502 superimposed on the data signal 106 in accordance with some embodiments. In the example of FIG. 5, the clock signal 502 has a frequency 504 equal to $$\frac{1}{2T},$$

or half the symbol rate 110. As shown, the data signal 106 may have a significant frequency component at or near the clock signal frequency 504. If the combined data and clock signals are provided to a receiver (e.g., receiver 200; FIG. 2A or receiver 230; FIG. 2B) as an input signal, a PLL (e.g., PLL 204) in the receiver still may extract the clock signal from the input signal, assuming that the clock signal has sufficient energy compared to the data signal. In some embodiments, a bandpass filter (e.g., bandpass filter 284, FIG. 2E) is used in conjunction with a PLL (e.g., PLL 282) to extract the clock signal from the input signal.

In some embodiments, the PLL that extracts the clock signal provides an output clock signal to a phase interpolator (e.g., 218) or to a sampling circuit (e.g., 214), wherein the output clock signal has a frequency equal to the data signal symbol rate, not to the clock signal frequency rate. For example, a 2:1 PLL may be used to isolate the clock signal 502, with a frequency 504 of half the symbol rate 110, and to generate an output clock with a frequency equal to the symbol rate 110.

In some embodiments, periodic offset cancellation is performed to at least partially cancel the clock signal at the sampling point. In the example of FIG. 5, in which the clock frequency 504 is half the symbol rate 110, the clock alternates between high and low for successive data symbol periods. An offset cancellation circuit (e.g., 232, FIG. 2B) provides a first offset to the input signal for data symbol periods in which the clock 502 is high and a second offset to the input signal for data symbol periods in which the clock 502 is low. In general, the number and periodicity of offsets depends on the ratio of the clock frequency to the symbol rate.

Attention is now directed to methods of receiving or transmitting data.

FIG. 6A is a flow diagram illustrating a method 600 of receiving data in accordance with some embodiments. While the method 600 described below includes operations that appear to occur in a specific order, it should be apparent that the method 600 can include more or fewer operations, that two or more of the operations can be performed in parallel, and that two or more operations can be combined into a single operation. For example, operations 602, 604, 610, and 620 can be performed in parallel while an input signal is being received.

An input signal is received at an interface (e.g., 203) coupled to one or more transmission lines. The input signal includes a data signal (e.g., data signal 106) and a clock signal (e.g., clock signal 108 or 122) superimposed on the data signal. The data signal has an associated symbol rate and an associated symbol period equal to the reciprocal of the associated symbol rate. The clock signal has a frequency equal to N times the associated symbol rate, where N is an integer (602).

The clock signal is extracted from the input signal to provide an extracted clock signal (604). In some embodiments, to extract the clock signal, the input signal is provided to a PLL (e.g., 204) coupled to the interface (606). In some embodiments, the PLL comprises a mixer (e.g., 206), a loop filter (e.g., 208), and a VCO (e.g., 210). The VCO has one or more outputs for providing the extracted clock signal. The input signal and one of the one or more outputs are provided to the mixer (608).

The phase of the extracted clock signal is adjusted (e.g., by a phase interpolator 218) to provide a phase-adjusted extracted clock signal (610). In some embodiments, a phase offset is determined (e.g., by an adaptive feedback circuit 216) and the phase of the extracted clock signal is adjusted by the phase offset (612). In some embodiments, a phase offset is determined in accordance with a target sampling point within a data symbol period (614).

In some embodiments, the input signal is integrated (e.g., by an integrator 212; FIG. 2A) over a majority of the associated symbol period to produce an integrated signal. The integrated signal is provided to a sampling circuit (e.g., 214) (616).

In some embodiments, an offset is provided to the input signal (e.g., by an offset cancellation circuit 232; FIG. 2B) to at least partially cancel the clock signal at a sampling point. The offset is at least substantially constant (618).

The data signal is sampled at the sampling point. The sampling is synchronized to the phase-adjusted extracted clock signal (620).

Figure 6B:
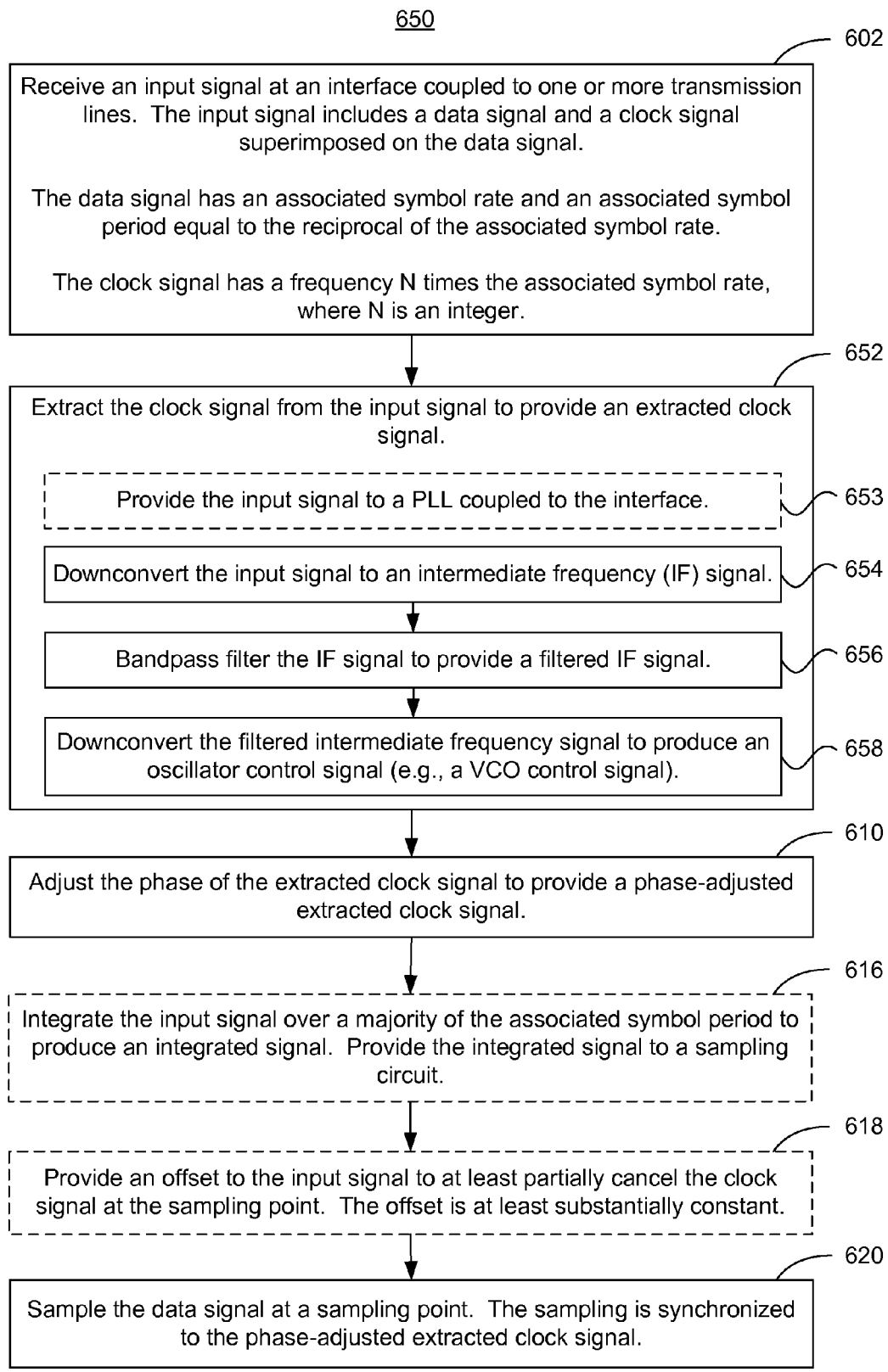

FIG. 6B is a flow diagram illustrating a method 650 of receiving data in accordance with some embodiments. While the method 650 described below includes operations that appear to occur in a specific order, it should be apparent that the method 650 can include more or fewer operations, that two or more of the operations can be performed in parallel, and that two or more operations can be combined into a single operation. For example, operations 602, 652, 610, and 620 can be performed in parallel while an input signal is being received.

An input signal is received at an interface coupled to one or more transmission lines, as described above with regard to operation 602 of process 600 (FIG. 6A).

The clock signal is extracted from the input signal to provide an extracted clock signal (652). In some embodiments, to extract the clock signal, the input signal is provided to a PLL (e.g., PLL 300; FIG. 3A or PLL 330; FIG. 3B) coupled to the interface (653). The input signal is down-converted to an intermediate frequency (IF) signal (654). In some embodiments, the PLL is configured to down-convert the input signal by a factor of between 2 and 10. The IF signal is bandpass filtered (e.g., by bandpass filter 304) to provide a filtered IF signal (656). The filtered IF signal is down-converted to produce an oscillator control signal (e.g., a VCO control signal) (658). In some embodiments, the oscillator control signal is filtered (e.g., by loop filter 308) prior to being provided to the oscillator (e.g., VCO 310).

In some embodiments, the PLL includes a first mixer (e.g., 302) for multiplying the input signal by a first internally generated clock signal so as to provide the intermediate frequency signal, and a second mixer (e.g., 306) for multiplying the filtered intermediate frequency signal by a second internally generated clock signal. In some embodiments, the first internally generated clock signal and the second internally generated clock signal have the same frequency. In some embodiments, the first internally generated clock signal and the second internally generated clock signal are the same signal. For example, in PLL 330 the first and second internally generated clock signals have frequencies equal to $$\frac{1}{2}f_o,$$

where $f_o$ is the frequency of the clock signal component of the input signal, and may be the same signal. In some embodiments, the first internally generated clock signal has a first frequency and the second internally generated clock signal has a second frequency that has an integer ratio relationship with the first frequency. For example, in PLL 300 the first internally generated clock signal has a first frequency equal to $$\frac{k-1}{k}f_o$$

and the second internally generated clock signal has a second frequency equal to $$\frac{1}{k}f_o.$$

In this example, the first and second frequencies differ by an integer ratio of k−1. In these examples, k is a positive integer.

In some embodiments, the internally generated clock signal provided to the second mixer has a frequency that substantially matches a primary frequency component of the filtered IF signal. For example, the internally generated clock signal provided to the second mixer has a frequency of $$\frac{1}{k}f_o$$

and the filtered IF signal has a primary frequency component substantially equal to $$\frac{1}{k}f_o.$$

The phase of the extracted clock signal is adjusted (e.g., by a phase interpolator 218) to provide a phase-adjusted extracted clock signal (610), as described above with regard to process 600.

In some embodiments, the input signal is integrated (e.g., by an integrator 212; FIG. 2A) over a majority of the associated symbol period to produce an integrated signal. The integrated signal is provided to a sampling circuit (e.g., 214) (616).

In some embodiments, an offset is provided to the input signal (e.g., by an offset cancellation circuit 232; FIG. 2B) to at least partially cancel the clock signal at a sampling point. The offset is at least substantially constant (618).

The data signal is sampled at the sampling point. The sampling is synchronized to the phase-adjusted extracted clock signal (620).

Figure 7:
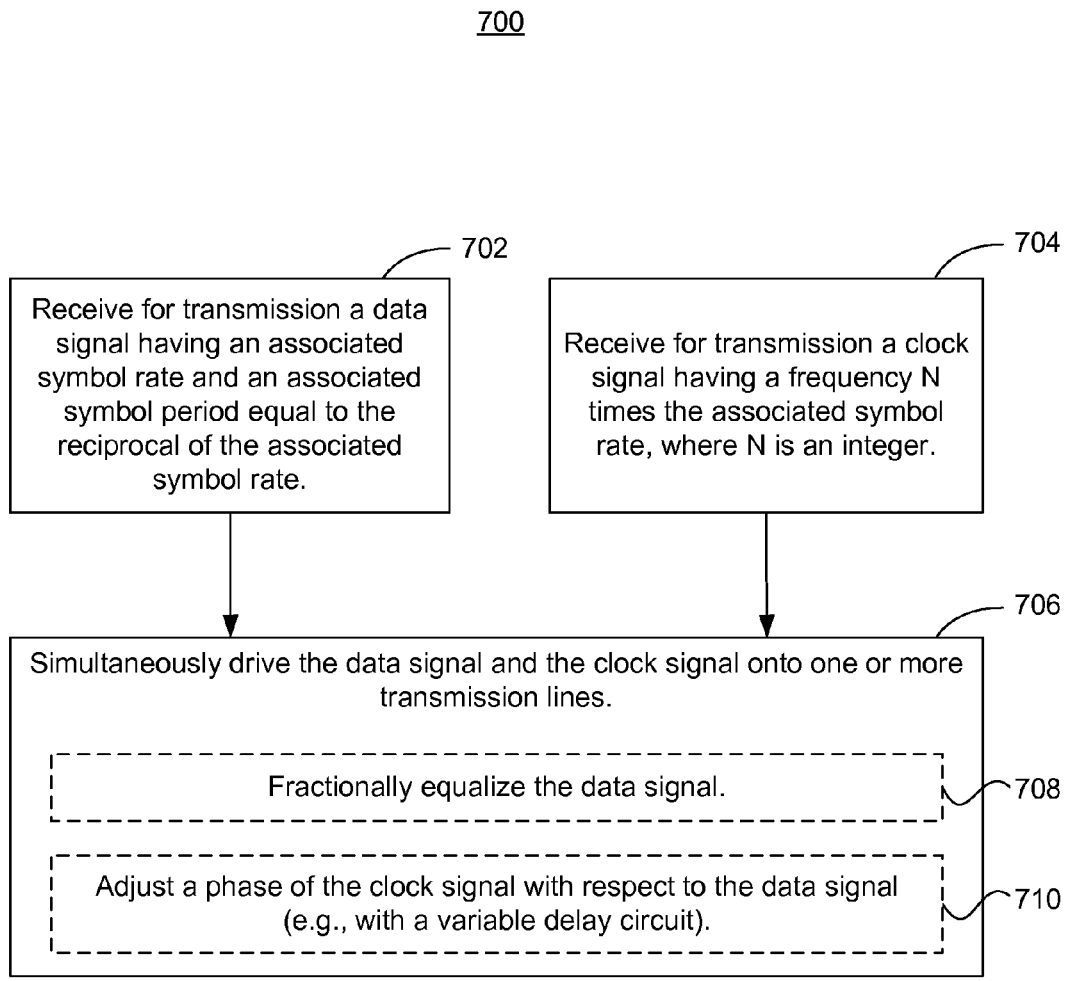
FIG. 7 is a flow diagram illustrating a method of transmitting data in accordance with some embodiments.

FIG. 7 is a flow diagram illustrating a method 700 of transmitting data in accordance with some embodiments. While the method 700 described below includes operations that appear to occur in a specific order, it should be apparent that the method 700 can include more or fewer operations, that two or more of the operations can be performed in parallel, and that two or more operations can be combined into a single operation. For example, operations 702, 704, and 706 can be performed in parallel.

A data signal (e.g., 106) having an associated symbol rate (e.g., symbol rate 110; FIGS. 1A & 1B) and an associated symbol period equal to the reciprocal of the associated symbol rate is received for transmission (702). A clock signal (e.g., 108 or 122) having a frequency equal to N times the associated symbol rate is received for transmission, where N is an integer (704). In some embodiments, the data signal and clock signal are received at a transmitter (e.g., transmitter 402; FIG. 4A or transmitter 432; FIG. 4B).

The data signal and the clock signal are simultaneously driven onto one or more transmission lines (706). For example, a data driver (e.g., 414) and a clock driver (e.g., 412) provide respective data and clock signals to a combiner (e.g., 416) that combines the signals and drives the combined signals onto a channel (e.g., 404).

In some embodiments, the data signal is symbol-rate or fractionally equalized (708). For example, in some embodiments the data driver 414 includes a symbol-rate or fractionally spaced linear equalizer.

In some embodiments, a phase of the clock signal is adjusted with respect to the data signal (710). For example, a variable delay circuit (e.g., circuit 410; FIG. 4A) delays the clock signal by a specified amount, thereby adjusting the clock signal phase with respect to the data signal. In another example, a phase interpolator (e.g., phase interpolator 434; FIG. 4B) adjusts the phase of the clock signal and provides the phase-adjusted clock signal to a data retimer (e.g., 436).

Figure 8:
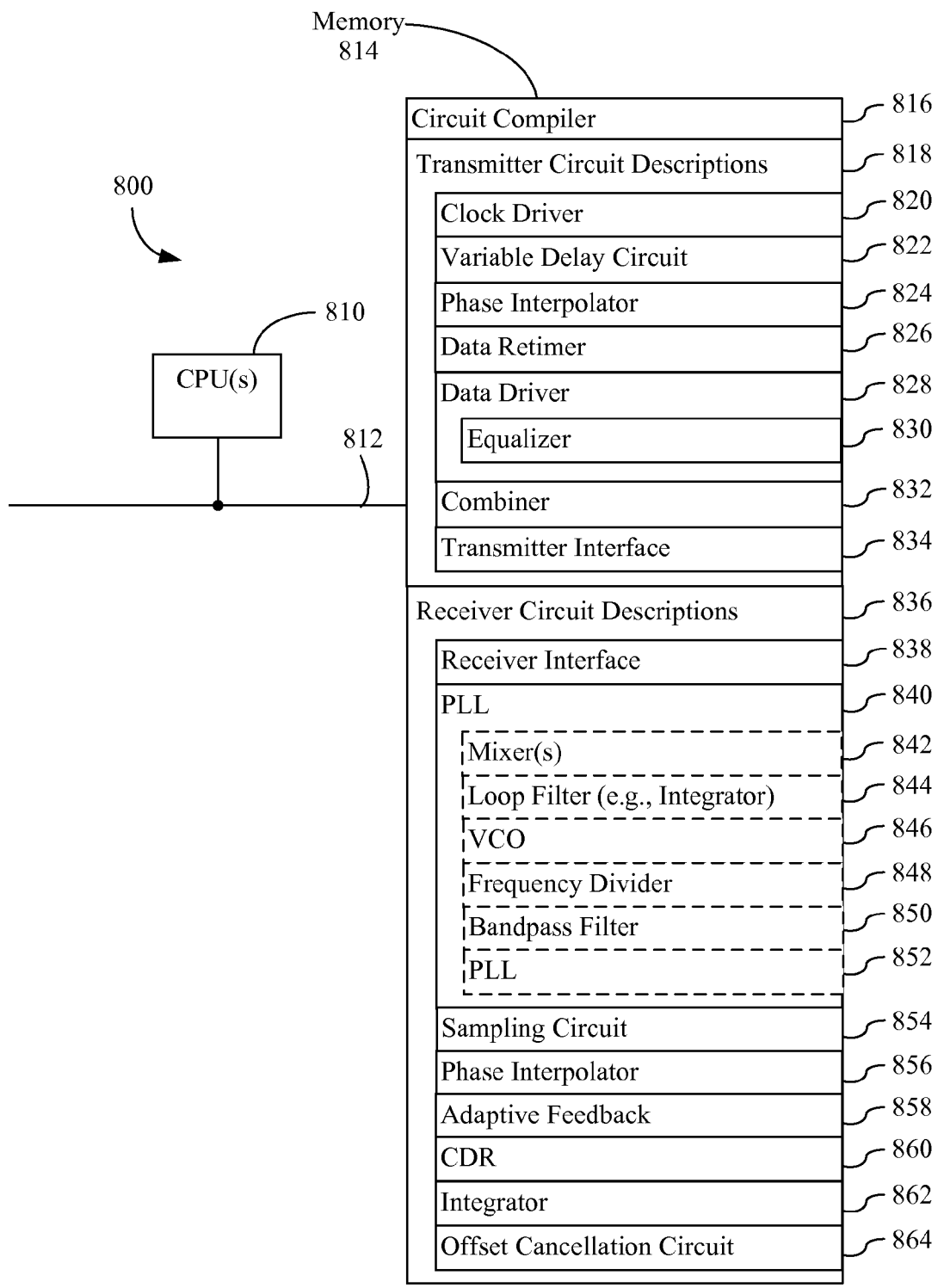
FIG. 8 is a block diagram of an embodiment of a system for storing computer readable files containing software descriptions of circuits for implementing transmitters and receivers in accordance with some embodiments.

FIG. 8 is a block diagram of an embodiment of a system 800 for storing computer readable files containing software descriptions of circuits for implementing transmitters and receivers in accordance with some embodiments. The system 800 may include at least one data processor or central processing unit (CPU) 810, memory 814, and one or more signal lines or communication busses 812 for coupling these components to one another. Memory 814 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 814 may optionally include one or more storage devices remotely located from the CPU(s) 810. In some embodiments, memory 814 stores in one or more of the previously mentioned memory devices a circuit compiler 816, transmitter circuit descriptions 818, and receiver circuit descriptions 836. The circuit compiler 816, when executed by a processor such as CPU(s) 810, processes one or more circuit descriptions to synthesize one or more corresponding circuits.

In some embodiments, transmitter circuit descriptions 818 include circuit descriptions for a clock driver 820, a variable delay circuit 822, a phase interpolator 824, a data retimer 826, a data driver 828, a combiner 832, and a transmitter interface 834. In some embodiments, the circuit description for the data driver 828 includes a circuit description for a linear equalizer 830 (e.g., a symbol-rate or fractionally spaced linear equalizer). More generally, the transmitter circuit descriptions 818 may include circuit descriptions for any of the transmitter circuit embodiments described above.

In some embodiments, receiver circuit descriptions 836 include circuit descriptions for a receiver interface 838, a PLL 840, a sampling circuit 854, a phase interpolator 856, an adaptive feedback circuit 858, a clock and data recovery (CDR) circuit 860, an integrator 862, and an offset cancellation circuit 864. In some embodiments, the circuit description for the PLL 840 includes circuit descriptions for one or more mixers 842, a loop filter 844, a VCO 846, a frequency divider 848, a bandpass filter 850, and a PLL 852 internal to the PLL 840. In some embodiments, the circuit description for the loop filter 844 includes a circuit description for an integrator. In some embodiments, the circuit description for the CDR circuit 860 is included in the circuit description for the adaptive feedback circuit 858. More generally, the receiver circuit descriptions 836 may include circuit descriptions for any of the receiver circuit embodiments described above.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A data receiver circuit, comprising:
    an interface to receive an input signal that comprises a data signal and a clock signal superimposed on the data signal, wherein the data signal has an associated symbol rate and an associated symbol period equal to the reciprocal of the associated symbol rate, and wherein the clock signal has a frequency N times the associated symbol rate, where N is an integer;
    a phase-locked loop (PLL) coupled to the interface to extract the clock signal from the input signal to provide an extracted clock signal;
    a phase interpolator to adjust the phase of the extracted clock signal to provide a phase-adjusted extracted clock signal; and
    a sampling circuit, synchronized to the phase-adjusted extracted clock signal, to sample the data signal at a sampling point.

2. The data receiver circuit of claim 1, wherein the PLL comprises a mixer, a loop filter, and a voltage-controlled oscillator (VCO) having one or more outputs to provide the extracted clock signal, wherein the input signal and one of the one or more outputs are provided to the mixer.

3. The data receiver circuit of claim 1, further comprising an adaptive loop to determine a phase offset, wherein the phase interpolator adjusts the phase of the extracted clock signal by the phase offset.

4. The data receiver circuit of claim 3, wherein the phase offset is determined in accordance with a target sampling point within a data symbol period.

5. The data receiver circuit of claim 1, further comprising an integrator, coupled to the interface, to integrate the input signal over a majority of the associated symbol period to produce an integrated signal and to provide the integrated signal to the sampling circuit.

6. The data receiver circuit of claim 1, further comprising an offset cancellation circuit to provide an offset to the input signal to at least partially cancel the clock signal at the sampling point, wherein the offset is at least substantially constant.

7. The data receiver circuit of claim 1, wherein the interface is coupled to one or more transmission lines.

8. A data receiver circuit, comprising:
    an interface to receive an input signal that comprises a data signal and a clock signal superimposed on the data signal, wherein the data signal has an associated symbol rate and an associated symbol period equal to the reciprocal of the associated symbol rate, and wherein the clock signal has a frequency N times the associated symbol rate, where N is an integer;
    a phase-locked loop (PLL) coupled to the interface to extract the clock signal from the input signal to provide an extracted clock signal by downconverting the input signal to an intermediate frequency signal, bandpass filtering the intermediate frequency signal to provide a filtered intermediate frequency signal, and downconverting the filtered intermediate frequency signal to produce a VCO control signal;
    a phase interpolator to adjust the phase of the extracted clock signal to provide a phase-adjusted extracted clock signal; and
    a sampling circuit, synchronized to the phase-adjusted extracted clock signal, to sample the data signal at a sampling point.

9. The data receiver circuit of claim 8, wherein the PLL is configured to downconvert the input signal by a factor of between 2 and 10.

10. The data receiver circuit of claim 8, wherein the PLL includes a first mixer to multiply the input signal by a first internally generated clock signal so as to provide the intermediate frequency signal, and a second mixer to multiply the filtered intermediate frequency signal by a second internally generated clock signal.

11. The data receiver circuit of claim 10, wherein the first internally generated clock signal and the second internally generated clock signal have a same frequency.

12. The data receiver circuit of claim 10, wherein the first internally generated clock signal and the second internally generated clock signal are the same signal.

13. The data receiver circuit of claim 10, wherein the first internally generated clock signal has a first frequency and the second internally generated clock signal has a second frequency that has an integer ratio relationship with the first frequency.

14. The data receiver circuit of claim 8, wherein the PLL includes a mixer to multiply the filtered intermediate frequency signal by an internally generated clock signal.

15. The data receiver circuit of claim 14, wherein the internally generated clock signal has a frequency that substantially matches a primary frequency component of the filtered intermediate frequency signal.

16. A method of receiving data, comprising:
- receiving, at an interface, an input signal that comprises a data signal and a clock signal superimposed on the data signal, wherein the data signal has an associated symbol rate and an associated symbol period equal to the reciprocal of the associated symbol rate, and wherein the clock signal has a frequency N times the associated symbol rate, where N is an integer;
- extracting the clock signal from the input signal to provide an extracted clock signal;
- adjusting the phase of the extracted clock signal to provide a phase-adjusted extracted clock signal; and
- sampling the data signal at a sampling point, synchronized to the phase-adjusted extracted clock signal.

17. The method of claim 16, wherein extracting the clock signal from the input signal to provide an extracted clock signal includes providing the input signal to a phase-locked loop (PLL).

18. The method of claim 17, wherein the PLL comprises a mixer, a loop filter, and a voltage-controlled oscillator (VCO) having one or more outputs to provide the extracted clock signal, wherein the input signal and one of the one or more outputs are provided to the mixer.

19. A computer readable medium containing circuit description data that, when operated on by a circuit compiler program being executed by a processor, synthesizes a data receiver circuit that includes:
- an interface to receive an input signal that comprises a data signal and a clock signal superimposed on the data signal, wherein the data signal has an associated symbol rate and an associated symbol period equal to the reciprocal of the associated symbol rate, and wherein the clock signal has a frequency N times the associated symbol rate, where N is an integer;
- a phase-locked loop (PLL) coupled to the interface to extract the clock signal from the input signal to provide an extracted clock signal;
- a phase interpolator to adjust the phase of the extracted clock signal to provide a phase-adjusted extracted clock signal; and
- a sampling circuit to sample the data signal at a sampling point, synchronized to the phase-adjusted extracted clock signal.

20. A data receiver circuit, comprising:
- means for receiving, at an interface, an input signal that comprises a data signal and a clock signal superimposed on the data signal, wherein the data signal has an associated symbol rate and an associated symbol period equal to the reciprocal of the associated symbol rate, and wherein the clock signal has a frequency N times the associated symbol rate, where N is an integer;
- means for extracting the clock signal from the input signal to provide an extracted clock signal;
- means for adjusting the phase of the extracted clock signal to provide a phase-adjusted extracted clock signal; and
- means for sampling the data signal at a sampling point, synchronized to the phase-adjusted extracted clock signal.

21. A data receiver circuit, comprising:
- means for receiving, at an interface, an input signal that comprises a data signal and a clock signal superimposed on the data signal, wherein the data signal has an associated symbol rate and an associated symbol period equal to the reciprocal of the associated symbol rate, and wherein the clock signal has a frequency N times the associated symbol rate, where N is an integer;
- means for extracting the clock signal from the input signal to provide an extracted clock signal, including means for downconverting the input signal to an intermediate frequency (IF) signal, means for bandpass filtering the IF signal to provide a filtered IF signal, and means for downconverting the filtered IF signal to produce an oscillator control signal;
- means for adjusting the phase of the extracted clock signal to provide a phase-adjusted extracted clock signal; and
- means for sampling the data signal at a sampling point, synchronized to the phase-adjusted extracted clock signal.

* * * * *